(12) United States Patent
Yang et al.

(10) Patent No.: US 10,845,717 B2
(45) Date of Patent: *Nov. 24, 2020

(54) LENS CONTROL FOR LITHOGRAPHY TOOLS

(71) Applicant: Taiwan Semiconductor Manufacturing Co., Ltd., Hsinchu (TW)

(72) Inventors: Yueh Lin Yang, Tainan (TW); Chi-Hung Liao, Sanchong (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/814,828

(22) Filed: Mar. 10, 2020

(65) Prior Publication Data

US 2020/0209764 A1    Jul. 2, 2020

Related U.S. Application Data

(63) Continuation of application No. 16/007,786, filed on Jun. 13, 2018, now Pat. No. 10,627,727.

(51) Int. Cl.
*G03F 7/20*  (2006.01)
*G02B 7/00*  (2006.01)

(52) U.S. Cl.
CPC ......... *G03F 7/70825* (2013.01); *G02B 7/005* (2013.01); *G03F 7/706* (2013.01); *G03F 7/70141* (2013.01); *G03F 7/70883* (2013.01); *G03F 7/70908* (2013.01); *G03F 7/70916* (2013.01)

(58) Field of Classification Search
CPC ..... G02B 7/005; G03F 7/70141; G03F 7/706; G03F 7/70825; G03F 7/70883; G03F 7/70908; G03F 7/70916
USPC ........................................ 355/30, 67, 68, 77
See application file for complete search history.

(56) References Cited

U.S. PATENT DOCUMENTS

| 2003/0189696 | A1  | 10/2003 | Sumiyoshi et al. |
| 2004/0059444 | A1* | 3/2004  | Tsukakoshi ............ G02B 7/023 700/59 |
| 2006/0001854 | A1* | 1/2006  | Singer ................ G02B 17/0657 355/67 |
| 2009/0073412 | A1* | 3/2009  | Pazidis ............... G03F 7/70308 355/67 |
| 2009/0103065 | A1  | 4/2009  | Yoshihara et al. |

* cited by examiner

*Primary Examiner* — Colin W Kreutzer
(74) *Attorney, Agent, or Firm* — Seed IP Law Group LLP

(57) ABSTRACT

Embodiments described herein relate to a dynamically controlled lens used in lithography tools. Multiple regions of the dynamic lens can be used to transmit a radiation beam for lithography process. By allowing multiple regions to transmit the radiation beam, the dynamically controlled lens can have an extended life cycle compared to conventional fixed lens. The dynamically controlled lens can be replaced or exchanged at a lower frequency, thus, improving efficiency of the lithography tools and reducing production cost.

20 Claims, 12 Drawing Sheets

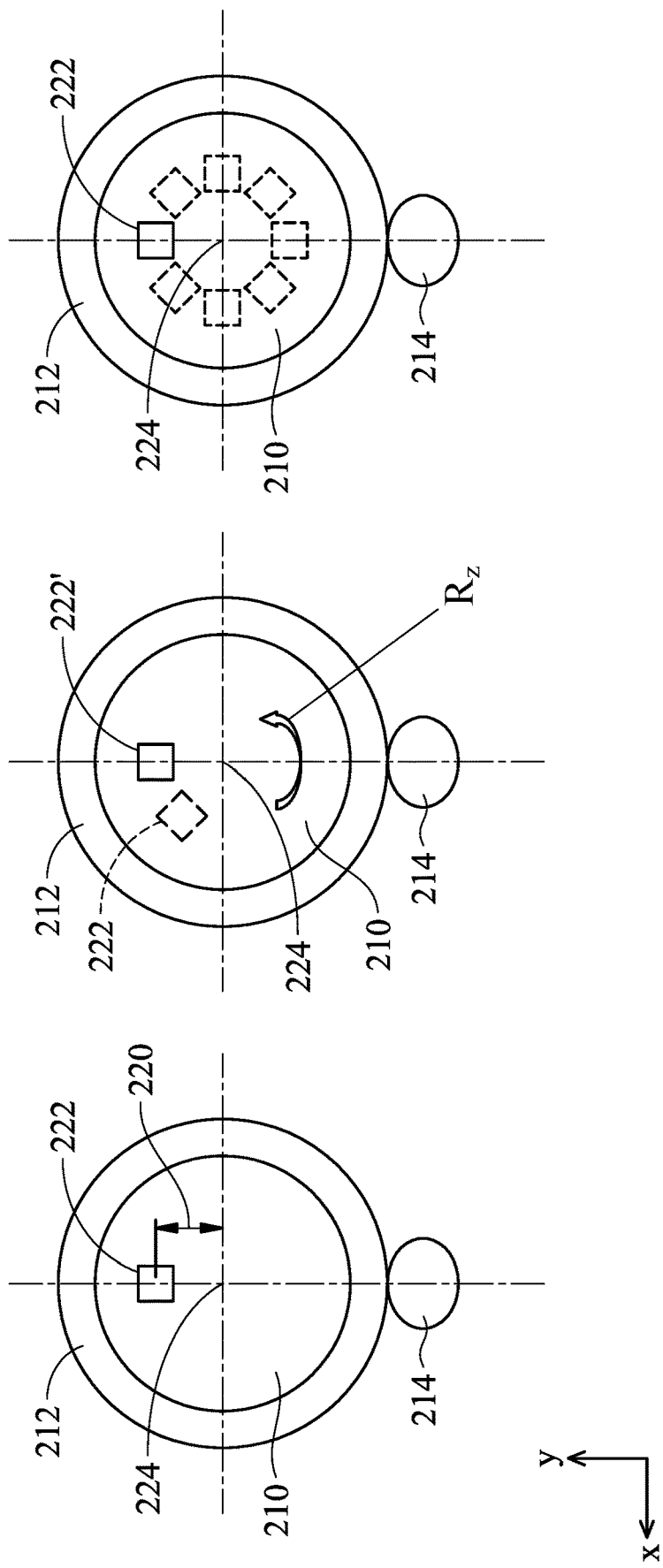

LENS CONTROL FOR LITHOGRAPHY TOOLS

BACKGROUND

In semiconductor manufacturing, lithography tools are used to apply patterns onto substrates by selectively exposing photoresist layers on the substrates to a radiation beam. Optical lenses are used in a lithography apparatus to direct the radiation beam from a radiation source to the substrate being processed. Optical lenses in lithography tools are made of fine quality materials and need to be replaced regularly because of contamination acquired during operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a schematic plan view of a dynamic lens and a first beam region in alignment with an optical path in a lithography tool according to some embodiments.

FIG. 2C is a schematic plan view of the dynamic lens aligning a second beam region with the optical path according to some embodiments.

FIG. 2D is a schematic plan view of the dynamic lens and a plurality of beam regions according to some embodiments.

DETAILED DESCRIPTION

Figure 1:
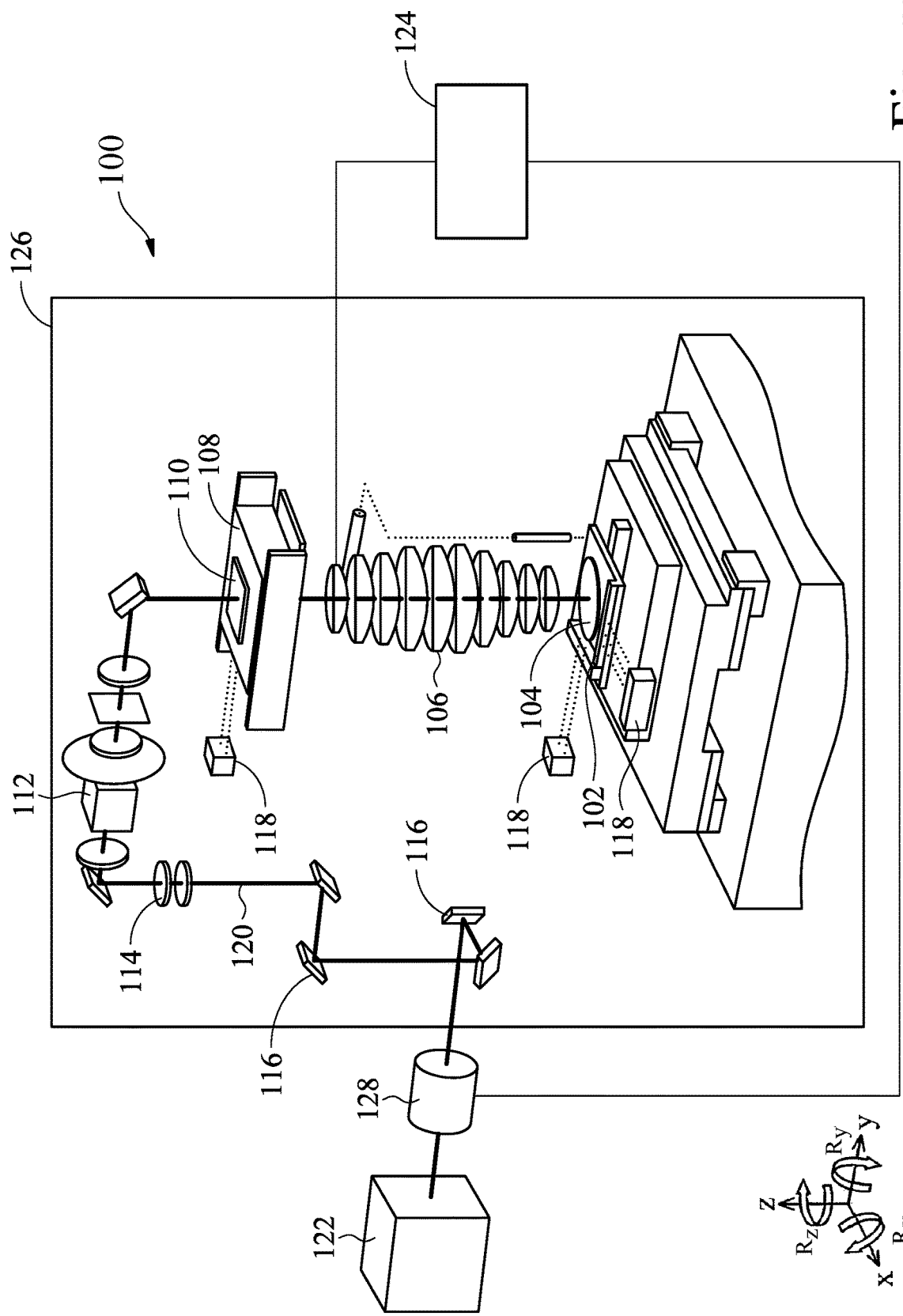
FIG. 1 is a schematic view of a lithography tool according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to dynamic lens used in lithography tools. In some embodiments, the dynamic lens includes one or more actuators to align different regions on a lens surface with an optical path travelled by a radiation beam in a lithography tool. During operation, multiple regions on the lens surface of the dynamic lens may be sequentially aligned with the optical path. A plurality of substrates can be processed while the optical path aligns with each of the multiple regions.

FIG. 1 is a schematic view of a lithography tool 100 according to some embodiments. The lithography tool 100 is or includes an alignment and exposure tool, also known as a stepper and a scanner, configured to transfer circuit design patterns to a light sensitive layer on a substrate. The lithography tool 100 may be an ultra violet (UV) lithography tool, an immersion lithography tool, an extreme ultra violet (EUV) lithography tool, an electron beam lithography tool, an x-ray lithography tool, an ion projection lithography tool, or any suitable exposure tools using laser radiation source to generate a radiation beam for exposure.

The lithography tool 100 includes a substrate stage 102 configured to secure a substrate 104 for processing. In some embodiments, the substrate stage 102 includes a number of actuators configured to move the substrate 104 in a number of degrees of freedom. In some embodiments, the substrate stage 102 is configured to move the substrate 104 in six degrees of freedom—X, Y, Z, Rx, Ry, and Rz using any number of actuators, such as six actuators.

The lithography tool 100 also includes a projection optics module 106. The projection optics module 106 includes a series of optical elements, such as optical lenses or mirrors, which function to reduce the size of patterns to be transferred to the substrate 104. In FIG. 1, the projection optics module 106 includes a plurality of optical lens arranged in a series manner. In some embodiments, the projection optics module 106 includes a plurality of mirrors arranged to deliver a light beam to the substrate stage 102.

The lithography tool 100 includes a mask stage 108 configured to secure a reticle or a mask 110 thereon. The mask stage 108 and the substrate stage 102 are positioned on opposite sides of the projection optics module 106. The mask 110 has a pattern to be transferred to the substrate 104 through the projection optics module 106. In some embodiments, the mask stage 108 is movable and rotatable to align the mask 110 for exposure. In some embodiments, the mask stage 108 includes a number of actuators configured to move the mask 110 in a number of degrees of freedom, for example, in six degrees of freedom—X, Y, Z, Rx, Ry, and Rz.

The lithography tool 100 further includes a condenser unit 112. The condenser unit 112 includes a plurality of optical elements, such as optical lenses or mirrors, to focus a light beam towards the mask 110 on the mask stage 108.

The lithography tool 100 is connected to a radiation source 122 configured to provide a light beam for transferring patterns from the mask 110 to the substrate 104. The radiation source 122 is configured to emit a light beam in an electromagnetic spectrum suitable for the exposure process to be performed in a desired lithography process. The radiation source 122 may be configured to emit light beams in the ultraviolet spectrum (such as extreme ultra violet (EUV), vacuum ultra violet (VUV), and deep ultraviolet (DUV)), visible spectrum, x-ray spectrum, or microwave spectrum. In some embodiments, the radiation source 122 is an excimer laser. In some embodiments, the radiation source 122 is a mercury lamp. In some embodiments, a lens assembly 128 is positioned between the radiation source 122 and the lithography tool 100 to collect, condense, collimate, or otherwise prepare a light beam lithography processes.

Other optical elements, such as filters 114 and mirrors 116 may be optionally positioned in the lithography tool 100 to direct a light beam from the radiation source 122 towards the substrate 104 on the substrate stage 102 along an optical path 120. In some embodiments, other elements, such as a shutter, a collimator lens, are positioned in suitable locations along the optical path 120 to facilitate exposure operations in the lithography tool 100.

In some embodiments, the lithography tool 100 includes a housing 126. The housing 126 defines an inner volume. A vacuum pump, not shown, may be connected to the housing to establish a vacuum environment in the inner volume. The substrate stage 102 is disposed in the housing 126 so that the lithography process may be performed in a vacuum state. Other components of the lithography tool 100, such as the condenser unit 112, the mask stage 108, and the projection optics module 106, may be disposed in the same housing 126 or in individual housings.

In some embodiments, the lithography tool 100 includes alignment sensors 118 positioned at various locations. The alignment sensors 118 are used to guide the substrate stage 102 and/or the mask stage 108 to align patterns on the mask 110 with areas to be patterned on the substrate 104.

In some embodiments, the lithography tool 100 further includes a controller 124 connected to various components in the lithography tool 100. In some embodiments, the controller 124 is configured to dynamically control optical elements, such as lenses and mirrors, in the lithography tool 100 during operation. For example, the controller 124 sends commands to move an optical element to align various regions of the optical element with the optical path 120.

During operation, the optical elements, the substrate stage 102, and the mask stage 108 are moved to suitable positions so that the radiation beam from the radiation source 122 travels through the optical path 120 to convey a pattern on the mask 110 to the substrate 104. During operation, the radiation beam emitted by the radiation source 122 is directed to the condenser unit 112 through filters 114, the mirrors 116, and other optical elements. The condenser unit 112 focuses the radiation beam for patterning. In some embodiments, the radiation beam transmits through the mask 110 and carries the pattern in the mask 110. The projection optics module 106 shrinks the patterned radiation beam and projects the radiation beam towards the substrate 104.

The substrate 104 is a semiconductor substrate on which integrated circuit devices are to be formed. The substrate 104 has a photoresist layer formed thereon. In operation, the radiation beam is incident on the radiation sensitive photoresist layer transferring the pattern carried in the radiation beam to the photoresist layer. In some embodiments, the photoresist layer may include a chemically amplified resist (CAR). Alternatively or additionally, the photoresist layer may include a metal based photoresist. For example, the photoresist layer may include a metal-oxide resist on top of a sacrificial carbon layer, such as spin-on-carbon. The photoresist layer may also be included in a tri-layer mask having a bottom layer, a middle layer, and a top layer. The bottom layer may be a carbon organic layer. The middle layer may be a silicon-containing carbon layer used to help pattern the bottom layer. The photoresist layer may be the top layer.

As discussed above, the radiation beam travels along the optical path 120 during lithographic processes. Typically, the same lithography process is repeatedly performed on multiple substrates and/or multiple regions on a substrate. After performing a certain number of exposures, some optical elements may become contaminated, particularly at locations through which the optical path passes. The optical elements are fixed in position and the optical path 120 passes through a work region on optical elements, for example, near the center of a lens or center of a mirror. Traditionally, when the beam region on an optical element becomes contaminated, the optical element needs to be replaced.

In some embodiments, optical elements, such as lenses and mirrors, in the lithography tool 100 are dynamically controlled and movable to use more than one region on the optical elements as a beam region, e.g., the area of the optical element upon which the radiation beam is incident during operation. The dynamically controlled optical element moves relative to the optical path 120 to use different areas as a beam region when contamination has built up in another (e.g., previously used) beam region. The dynamically controlled optical element allows multiple areas on the optical element to be used as a beam region, therefore multiplying the lifespan of the optical element.

Figure 2A:
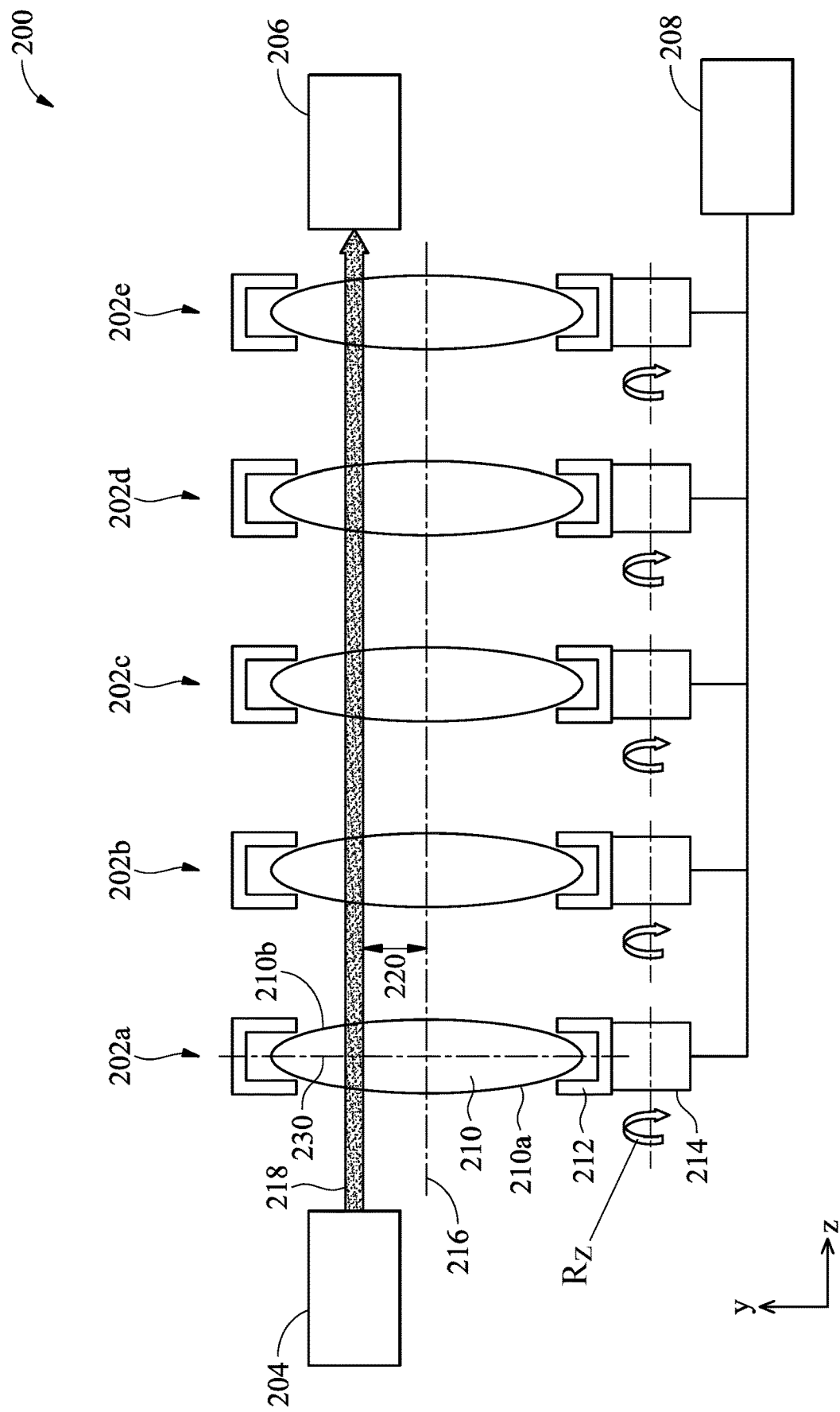
FIG. 2A is a schematic view of a dynamic lens assembly according to some embodiments.

FIG. 2A is a schematic view of a dynamic lens assembly 200 according to some embodiments. FIGS. 2B-2D are schematic plan views of a lens unit in the dynamic lens assembly 200.

The dynamic lens assembly 200 may be used in lithography tools, such as the lithography tool 100. In some embodiments, one or more optical modules in the lithography tool 100 include a dynamic lens assembly similar to the dynamic lens assembly 200. For example, the projection optics module 106, the condenser unit 112, or the lens assembly 128 can each include a dynamic lens assembly similar to the dynamic lens assembly 200.

The dynamic lens assembly 200 includes one or more lens units 202a, 202b, 202c, 202d, and 202e. Even though lens units 202a-202e are shown in FIG. 2A, the dynamic lens assembly 200 may include more or less lens units according to other examples.

The dynamic lens assembly 200 is disposed between a radiation source 204 and an appliance 206 to convey a radiation beam from the radiation source 204 to the appliance 206. In some embodiments, intermediate components may be positioned between the radiation source 204 and the dynamic lens assembly 200, or between the dynamic lens assembly 200 and the appliance 206. The radiation source 204 can be any suitable source configured to generate a light beam for using in a photolithography operation. For example, the radiation source 204 is configured to generate a laser radiation beam, a UV beam, a microwave light beam, or an x-ray beam. In some embodiments, the radiation source 204 is a laser radiation source configured to provide a laser radiation beam to a lithography tool. The appliance 206 includes any device or component that is downstream to the dynamic lens assembly 200 using the radiation beam for an operation. In some embodiments, the appliance 206 is a lithography tool, such as the lithography tool 100.

Each lens unit 202a-202e includes a lens 210, a frame 212 disposed around the lens 210, and an actuator 214 positioned to move the lens 210. The lens 210 is an optical element that refracts light passing therethrough. The lens 210 has two surfaces 210a, 210b. The surface 210a faces an incoming light beam. The surface 210b is opposing the surface 210a. Either one or both surfaces 210a, 210b are spherical-shaped to converge or diverge the incoming light beam on a principal focus. The surfaces 210a, 210b may be convex or concave to converge or diverge the incoming light beam. The lens 210 shown in FIG. 2A is a converging lens with two convex surfaces 210a, 210b. During operation, an incoming radiation beam enters the lens 210 from the surface 210a and exits the lens 210 from the surface 210b. In other embodiments, the lens 210 is a converging lens with one convex surface. In some embodiments, the lens 210 is a diverging lens including at least one concave surface. In some examples, the lens 210 is made of glass, fused silica, calcium fluoride, or any material suitable for refracting light beams at wavelengths used for a photo lithography process. The lens 210 in each lens unit 202a-e may be different to achieve different functions, may be the same, or any combination thereof.

The frame 212 is disposed around the edge of the lens 210. In some embodiments, the frame 212 is fixedly attached to the lens 210. The actuator 214 is moveably coupled to the frame 212 to move the lens 210 with the frame 212. In some embodiments, the actuator 214 is configured to rotate the lens 210 about an optical axis 216 along the z-axis. The optical axis 216 passes through an origin 224 of the lens 210 (shown FIG. 2B). The optical axis 216 is along the z direction. The actuator 214 rotates the lens 210 within a lens plane 230, which passes through the origin 224 of the lens 210 and is perpendicular to the optical axis 216 of the lens 210. In embodiments, the actuator 214 includes a motor.

During operation, a radiation beam travels along an optical path 218 that traverses the lenses 210 in the lens units 202a-202e. In some embodiments, within at least one of the lens units 202a-202e, the optical path 218 is at a distance away from the origin 224 of the corresponding lens 210. FIG. 2B is a schematic plan view of the lens 210. In FIG. 2B, a beam region 222 indicates an area where the optical path 218 intersects the lens 210. Thus, during operation, a radiation beam traverses the lens 210 at the beam region 222. A center of the beam region 222 is at a distance 220 away from the origin 224. When the lens 210 rotates about the origin 224, the optical path 218 intersects the lens 210 at a new beam region 222', as shown in FIG. 2C. FIG. 2D is a schematic plan view of the lens 210 showing a plurality of regions can be aligned with the optical path 218 to serve as a beam region 222 during operation.

During operation, contamination can gradually accumulate on the lens 210 in the region where the radiation beam traverses the lens 210, such as the beam region 222 in FIG. 2B. The contamination on the beam region 222 can cause the transmission rate of the lens 210 to decrease, thus, decreasing in the efficiency of the lithography tool. Additionally, when a radiation beam, such as a laser beam, traverses a lens, the radiation beam may create damage, such as compaction damage, to the lens. The damage to the lens may lead to loss of image quality in the lithography tool. Conventional lens units with fixed lenses require frequent replacement or exchange when the beam region is contaminated or damaged. Lenses 210 in the lens units 202a-202e can be rotated to use a "fresh" region as a beam region when the beam region has contamination or has been damaged. As a result, the lens units 202a-202e do not need to be exchanged or replaced as frequently as conventional lens units.

In some embodiments, the distance 220 between the origin 224 and the center of beam region 222 is selected to allow the optical path 218 to align with multiple regions that are not significantly overlapping. The larger the distance 220, the greater the number of regions can be used as beam regions, which can increase the life cycle of the lens unit 202a-202e. However, a larger distance can lead to drift in the optical path, which may result in decreased image quality in the lithography process. In some embodiments, a value of the distance 220 is approximately a diameter of a circle that inscribes the beam region 222.

Referring back to FIG. 2A, a controller 208 is connected to the lens units 202a-202e. In some embodiments, the controller 208 is connected to the actuators 214 to control the rotation of the lens units 202a-202e. In some embodiments, the lens units 202a-202e are arranged in a manner so that the origin 224 of each lens 210 in the lens units 202a-202e passes the same optical axis 216. In some embodiments, the lens units 202a-202e are rotated in synchronization to switch beam regions at the same frequency. In other embodiments, the lens units 202a-202e are controlled independently from each other.

Figure 3A:
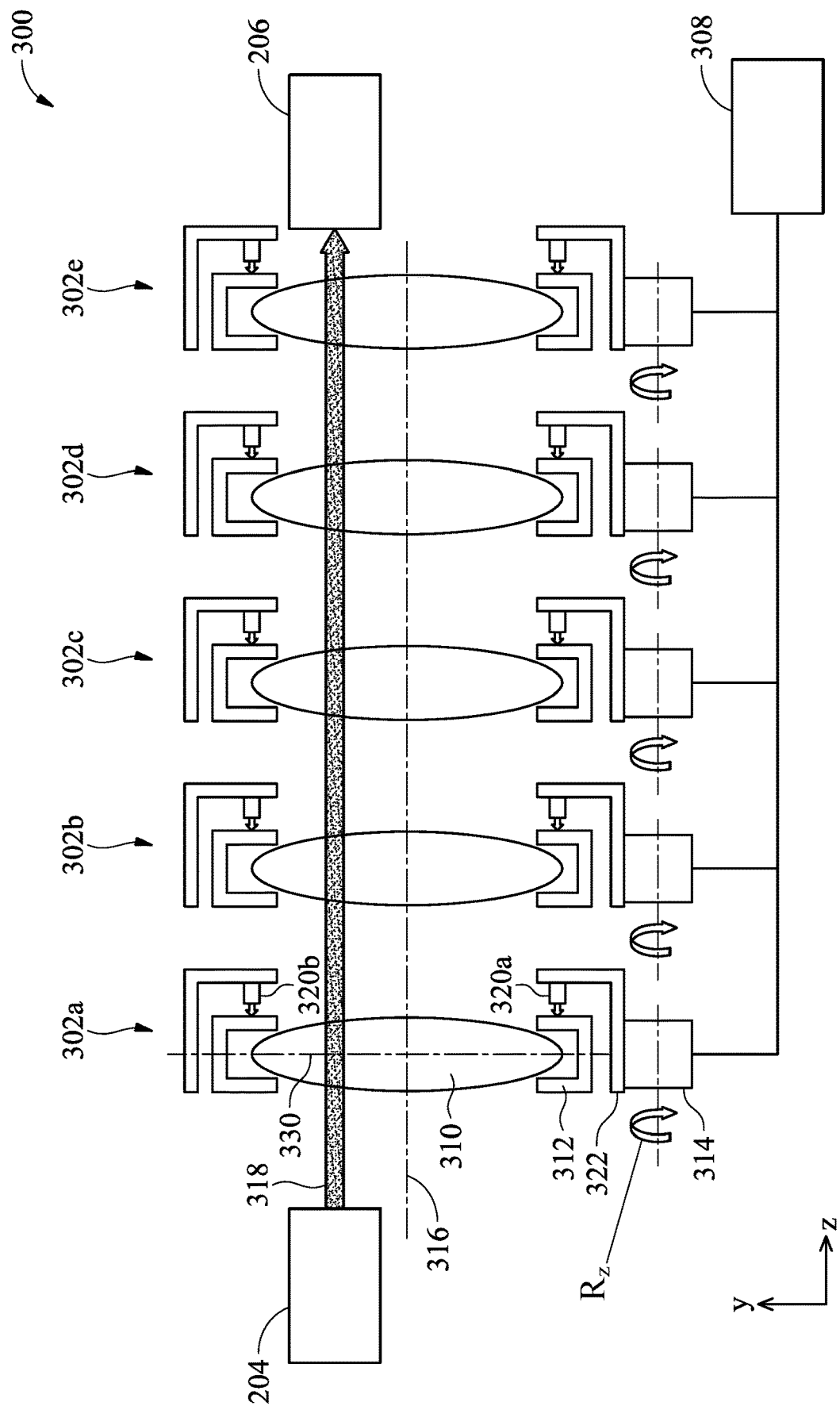
FIG. 3A is a schematic view of a dynamic lens assembly according to some embodiments.
Figure 3C:
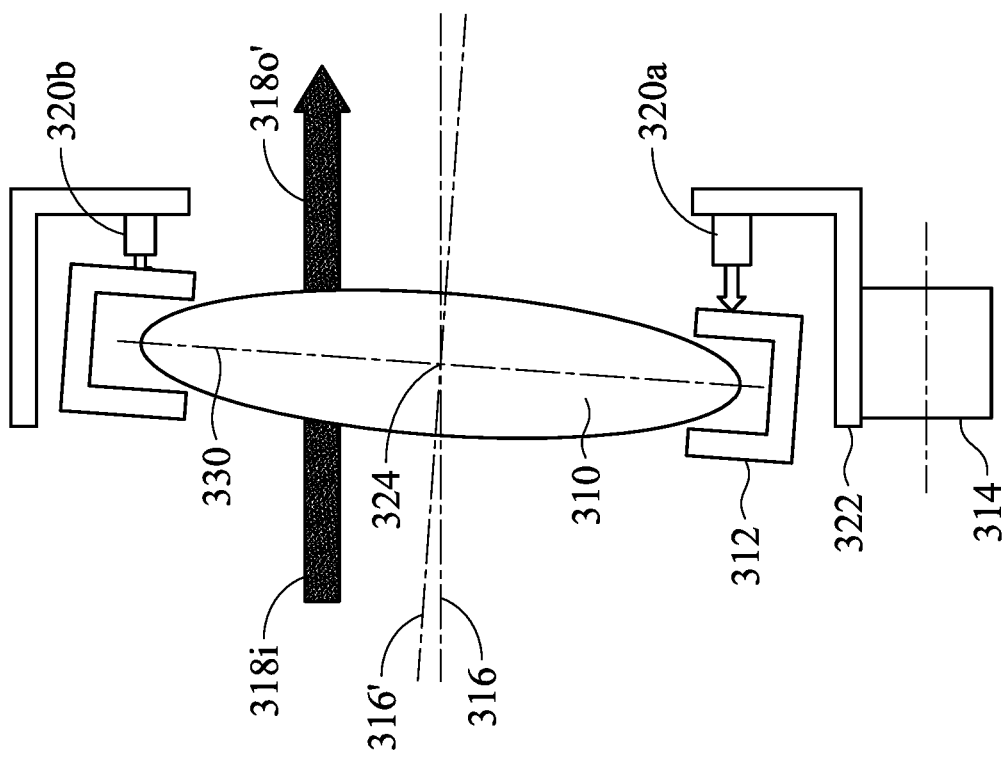
FIG. 3C is a schematic view of a dynamic lens in a tilted position according to some embodiments.
Figure 3B:
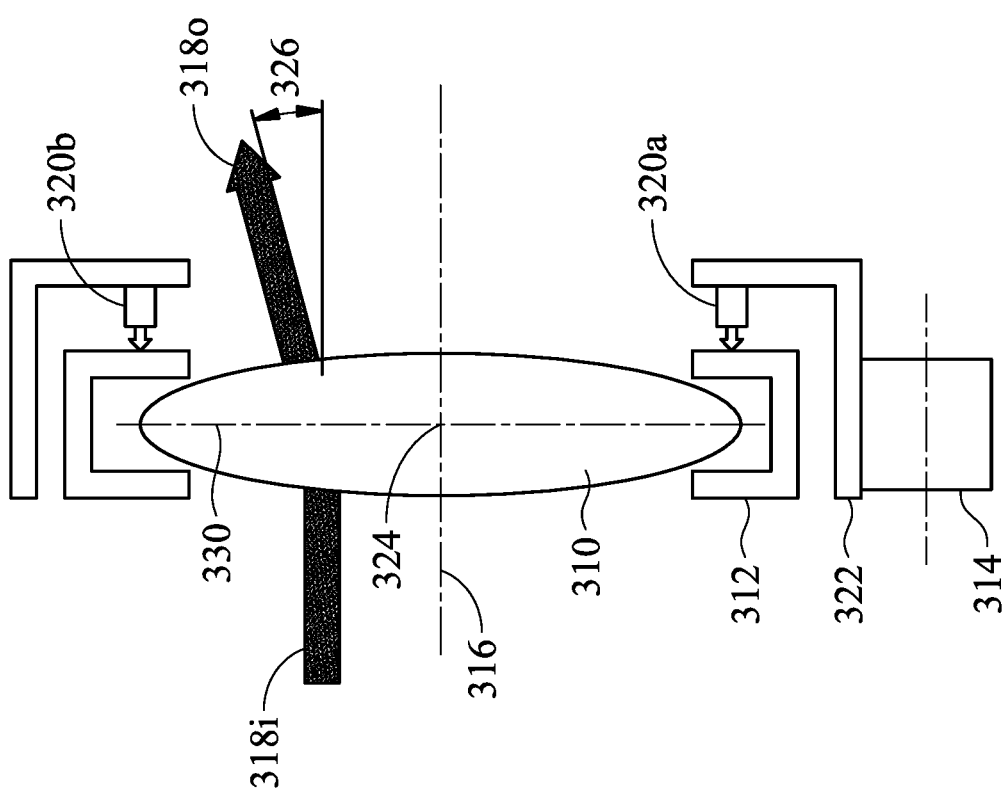
FIG. 3B is a schematic view of a dynamic lens in a non-tilting position according to some embodiments.
Figure 3D:
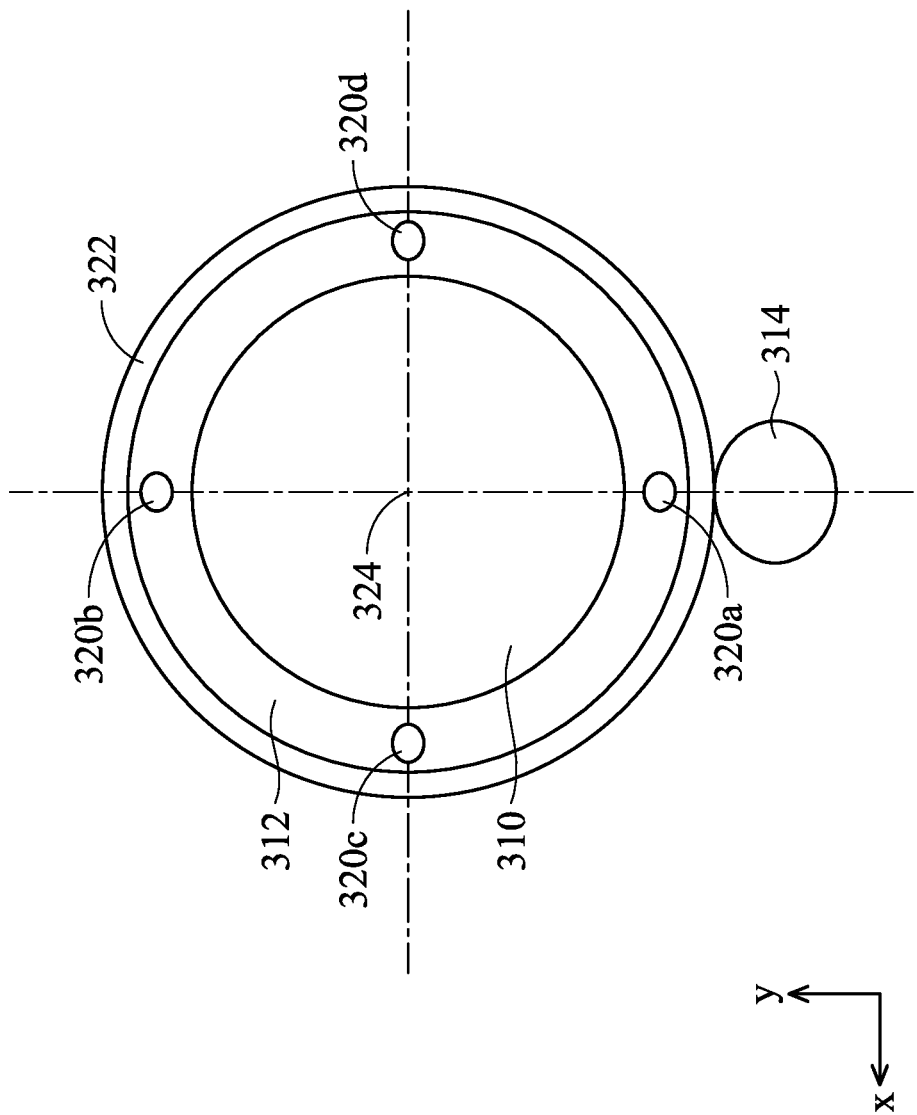
FIG. 3D is a schematic plan view of a lens housing showing tilting actuators according to some embodiments.

FIG. 3A is a schematic view of a dynamic lens assembly 300 according to some embodiments. The dynamic lens assembly 300 is similar to dynamic lens assembly 200 except the dynamic lens assembly 300 includes lens units having tilting actuators. FIG. 3B is a schematic view of a lens unit in the dynamic lens assembly 300 in a non-tilting position. FIG. 3C is a schematic view of the lens unit in the dynamic lens assembly 300 in a tilted position. FIG. 3D is a schematic plan view of a lens housing showing tilting actuators.

The dynamic lens assembly 300 includes one or more lens units 302a, 302b, 302c, 302d, and 302e. Even though lens units 302a-302e are shown in FIG. 3A, the dynamic lens assembly 300 may include more or less lens units according to other examples. The dynamic lens assembly 300 is disposed between the radiation source 204 and the appliance 206 to convey a radiation beam from the radiation source 204 to the appliance 206.

Each lens unit 302a-302e includes a lens 310, an inner frame 312 disposed around the lens 310 and an outer frame 322. The lens 310 is similar to the lens 210 described above. In some embodiments, the inner frame 312 is fixedly attached to the lens 310. A rotating actuator 314 is moveably coupled to the outer frame 322 to rotate the lens 310 about an origin 324 of the lens 310 (shown in FIG. 3D). The actuator 314 rotates the lens 310 within a lens plane 330, which passes through the origin 324 of the lens 310 and is perpendicular to an optical axis 316 of the lens 310. In some embodiments, the rotate actuator 314 includes a motor.

Each lens unit 302a-302e further includes one or more tilting actuators configured to tilt the lens 310. In some embodiments, each lens unit 302a-302e includes a respective tilting actuator 320a, 320b, 320c, 320d (shown in FIG. 3D) to tilt the lens 310 around the x-axis and y-axis. The tilting actuators 320a, 320b, 320c, 320d are coupled between the outer frame 322 and inner frame 312. Movements of the tilting actuators 320a, 320b, 320c, 320d adjusts the distances between the outer frame 322 and the inner frame 312 along the circumference of the inner frame 312 or the lens 310. Each tilting actuator 320a, 320b, 320c, 320d is movable independently from one another. The combined movements of the tilting actuator 320a, 320b, 320c, 320d result in the lens 310 tilting about the x-axis and/or y-axis. The tilting actuator 320a, 320b, 320c, 320c may be linear actuators (such as mechanical actuators), piezoelectric actuators, cylinders (such as pneumatic cylinders and hydraulic cylinders), or the like.

In some embodiments, as shown in FIG. 3D, four tilting actuators 320a, 320b, 320c, 320d are disposed along a circumference of the lens 310 at 90 degrees apart. In some embodiments, while the lens 310 is in the position shown in FIG. 3D, relative movements of the tilting actuators 320a, 320b cause the lens 310 to tilt about the x-axis while relative movements of tilting actuators 320c, 320d cause the lens 310 to tilt about y-axis. Because positions of the tilting actuators 320a, 320b, 320c, 320d relative to the x-axis and y-axis change when the lens 310 rotates by the rotating actuator 314, movements of tilting actuators 320a, 320b, 320c, 320d cause the lens 310 to tilt around different axes, although the same axes of rotation relative to the outer frame 322 may be maintained. Other arrangements of the tilting actuators, such as three actuators disposed along the circumference of the lens 310, can be used to achieve the same result.

During operation, a radiation beam travels along an optical path 318 that traverses the lenses 310 in the lens units 302a-302e. In some embodiments, the optical path 318 is parallel to the optical axis 316. In some embodiments, within at least one of the lens units 302a-302e, the optical path 318 is at a distance away from the origin 324 of the corresponding lens 310. Because of the optical path 318 is offset from the optical axis 316, the radiation beam may be no longer parallel to the optical axis 316 after passing through the lens 310. For example, as shown in FIG. 3B, an incoming radiation beam 318i is projected to the lens 310 along a direction parallel to the optical axis 316 and at a distance away from the optical axis 316. After traversing through the lens 310, an output radiation beam 318o is no longer parallel to the optical axis 316, instead the output radiation beam 318o is at an angle 326 from the optical axis 316.

In some embodiments, the lens 310 is tilted to correct the deviation of the optical path 318 caused by the offset between the optical path 318 and the optical axis 316. As shown in FIG. 3C, the tilting actuator 320a extends while the tilting actuator 320b retracts causing the lens 310 to tilt about the x-axis. The optical axis 316' after tilting is at an angel relative to the optical axis 316 prior to tilting. With the incoming radiation beam 318i remaining parallel to the optical axis 316 prior to tilting, the tilted lens 310 produces an output radiation beam 318o' that is also parallel to the optical axis 316.

In some embodiments, a controller 308 is connected to the lens units 302a-302e. In some embodiments, the controller 308 is connected to the rotating actuators 314 and the tilting actuators 320a-320d to control the rotation and tilting of the lens units 302a-302e.

In some embodiments, the lens units 302a-302e are arranged in a manner so that the origin 324 of each lens 310 in the lens units 302a-302e passes the same optical axis 316.

During operation, an incoming radiation beam is projected to the lens units 302a-e from an optical path that is parallel from the optical axis 316 but at a distance away from the optical axis 316 to allow multiple regions being used as beam regions. Prior to operation, each lens 310 is rotate to have a "clean" region align with the optical path 318 and tilted at a suitable angle to ensure that the optical path 318 remains parallel to the optical axis 316. When the beam region in the lens 310 becomes contaminated or damaged, the lens 310 is rotated to align a clean region with the optical path 318. In some embodiments, the tilting angle is adjusted after lens rotation.

Other arrangements of actuators can be used to achieve rotation and tilting of the lens 310. For example, the rotating actuator 314 is coupled to the inner frame 312 and positioned to rotate the lens 310 relative to the outer frame 322, and the tilting actuators 320a, 320b, 320c, 320d are coupled to the outer frame 322 and positioned to tilt the outer frame 322 and the lens 310 together.

Figure 4A:
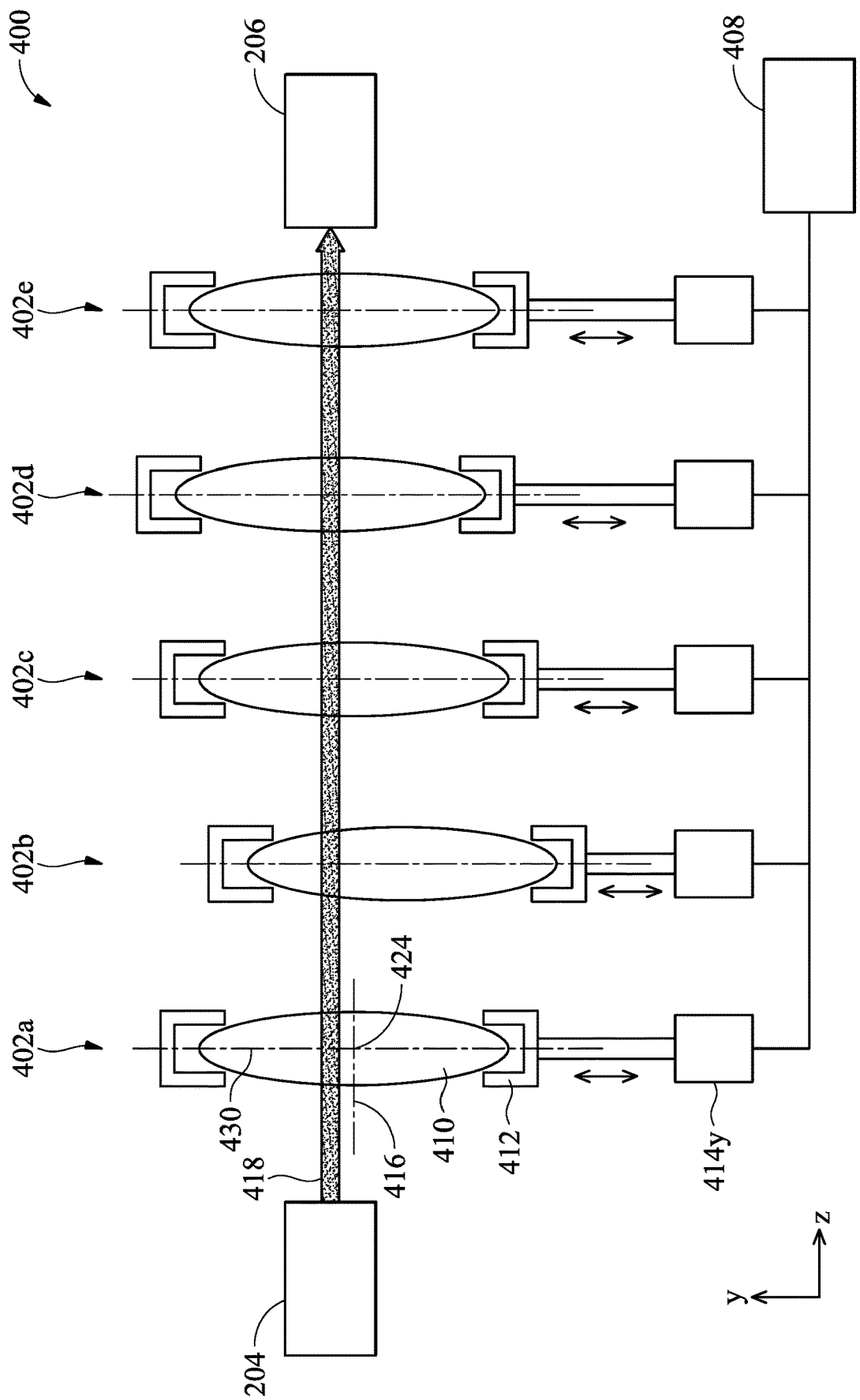
FIG. 4A is a schematic view of a dynamic lens assembly according to some embodiments.
Figure 4B:
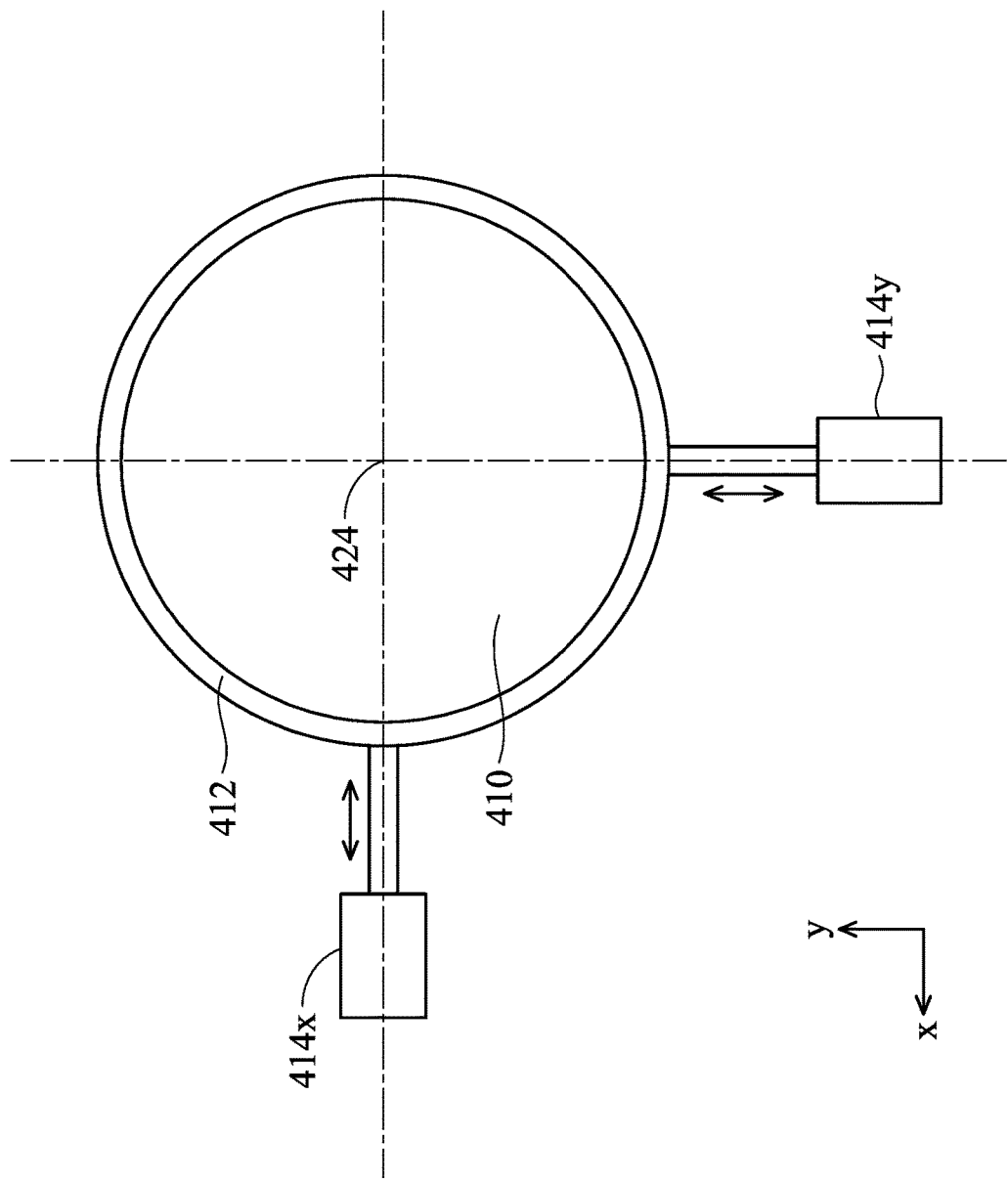
FIG. 4B is a schematic plan view of a dynamic lens with translation actuators according to some embodiments.
Figure 4C:
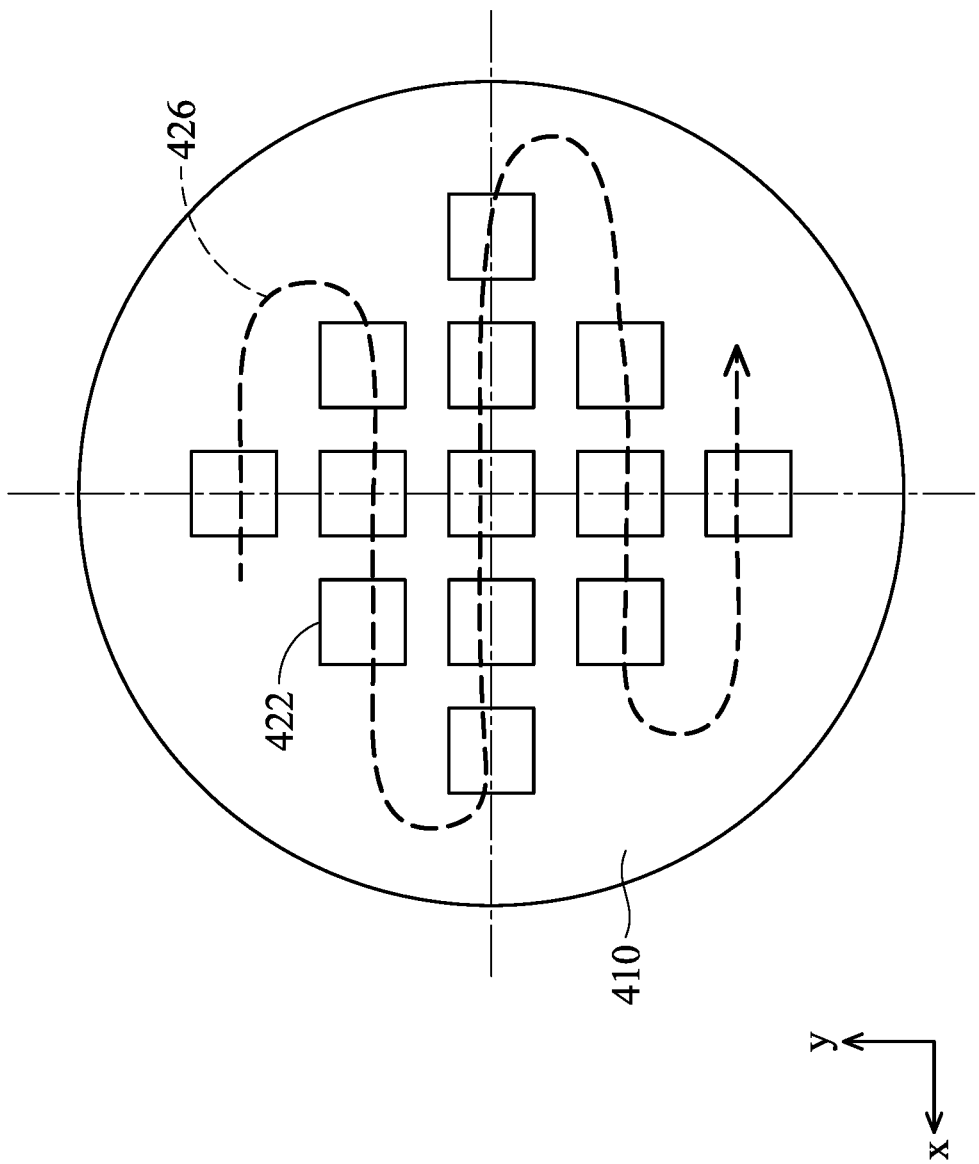
FIG. 4C is a schematic plan view of the dynamic lens and a plurality of beam regions according to some embodiments.

FIG. 4A is a schematic view of a dynamic lens assembly 400 according to some embodiments. The dynamic lens assembly 400 is similar to the dynamic lens assembly 200 except the dynamic lens assembly 400 includes lens units having translation actuators to move the lens. FIG. 4B is a schematic plan view of a lens unit in the dynamic lens assembly 400 showing translation actuators. FIG. 4C is a schematic plan view of the lens showing an arrangement of usable beam regions.

The dynamic lens assembly 400 includes one or more lens units 402a, 402b, 402c, 402d, and 402e. The dynamic lens assembly 400 is disposed between a radiation source 204 and an appliance 206 to convey a radiation beam from the radiation source 204 to the appliance 206.

Each lens unit 402a-402e includes a lens 410, a frame 412 disposed around the lens 410, and a translation actuators 414x, 414y positioned to move the lens 410 along the x-axis and y-axis respectively. The lens 410 is similar to the lens 210 described above. The frame 412 is disposed around the edge of the lens 410. In some embodiments, the frame 412 is fixedly attached to the lens 410. The translation actuators 414x, 414y are moveably coupled to the frame 412 to move the lens 410 with the frame 412. The translation actuators 414x, 414y move the lens 410 within a lens plane 430, which passes through an origin 424 of the lens 410 and is perpendicular to an optical axis 416 of the lens 410. In some embodiments, the translation actuators 414x, 414y are linear actuators (such as mechanical actuators), piezoelectric actuators, cylinders (such as hydraulic or pneumatic cylinders), or the like.

In some embodiments, a controller 408 is connected to the lens units 402a-402e. In some embodiments, the controller 408 is connected to the translation actuators 414x, 414y to control the lens units 402a-402e.

During operation, an incoming radiation beam is projected to the lens units 402a-e from an optical path 418. Prior to operation, each lens 410 is moved by the translation actuators 414x, 414y to have a "clean" region align with the optical path 418. When the beam region in the lens 410 becomes contaminated or damaged, the lens 410 is moved to align a clean region with the optical path 418. FIG. 4C schematically illustrates a plurality of beam regions 422 that can be used as beam regions. In some embodiments, the lens 410 is moved in a manner that the beam regions 422 are used sequentially along a path 426.

Figure 5A:
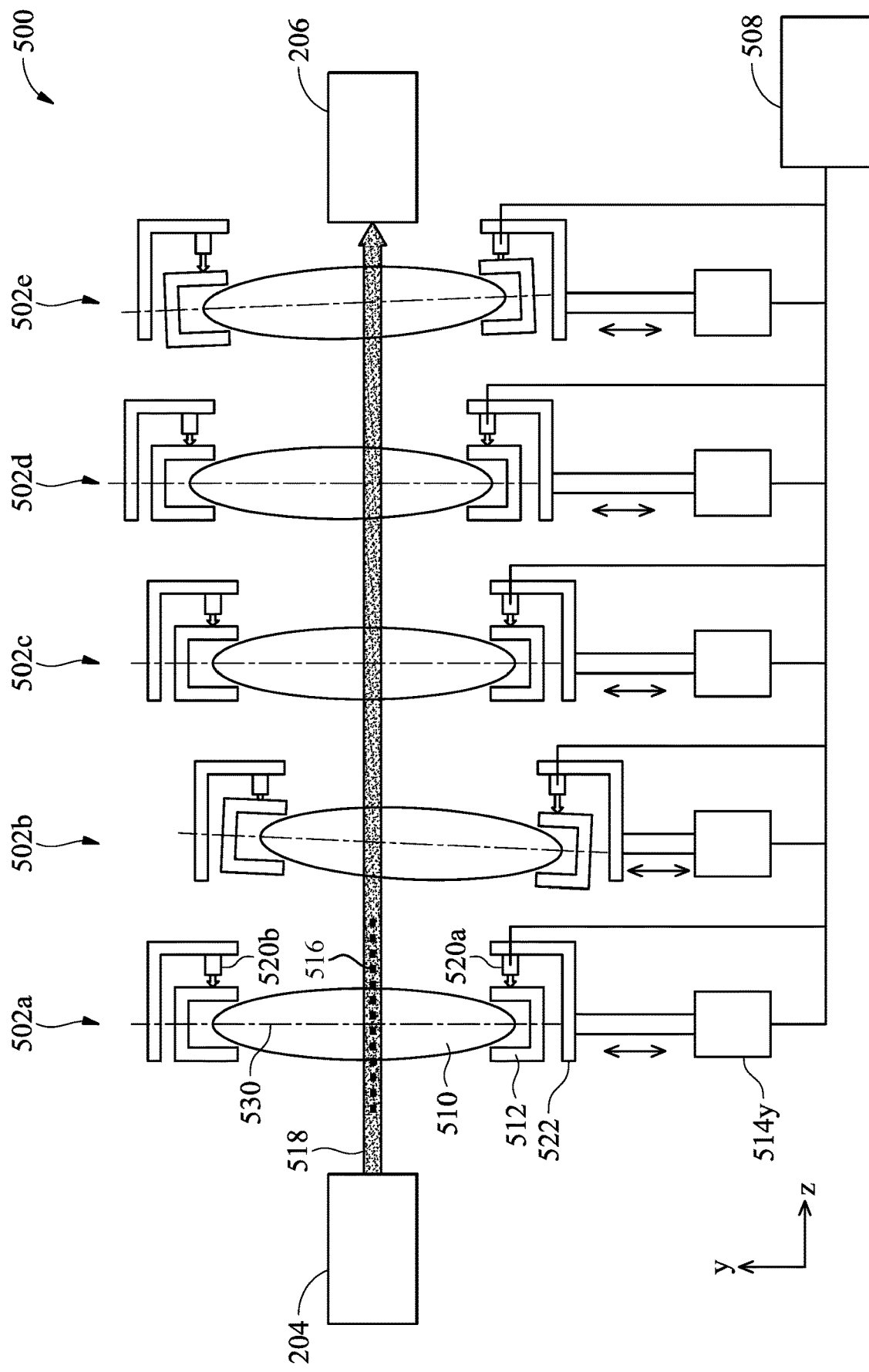
FIG. 5A is a schematic view of a dynamic lens assembly according to some embodiments.
Figure 5B:
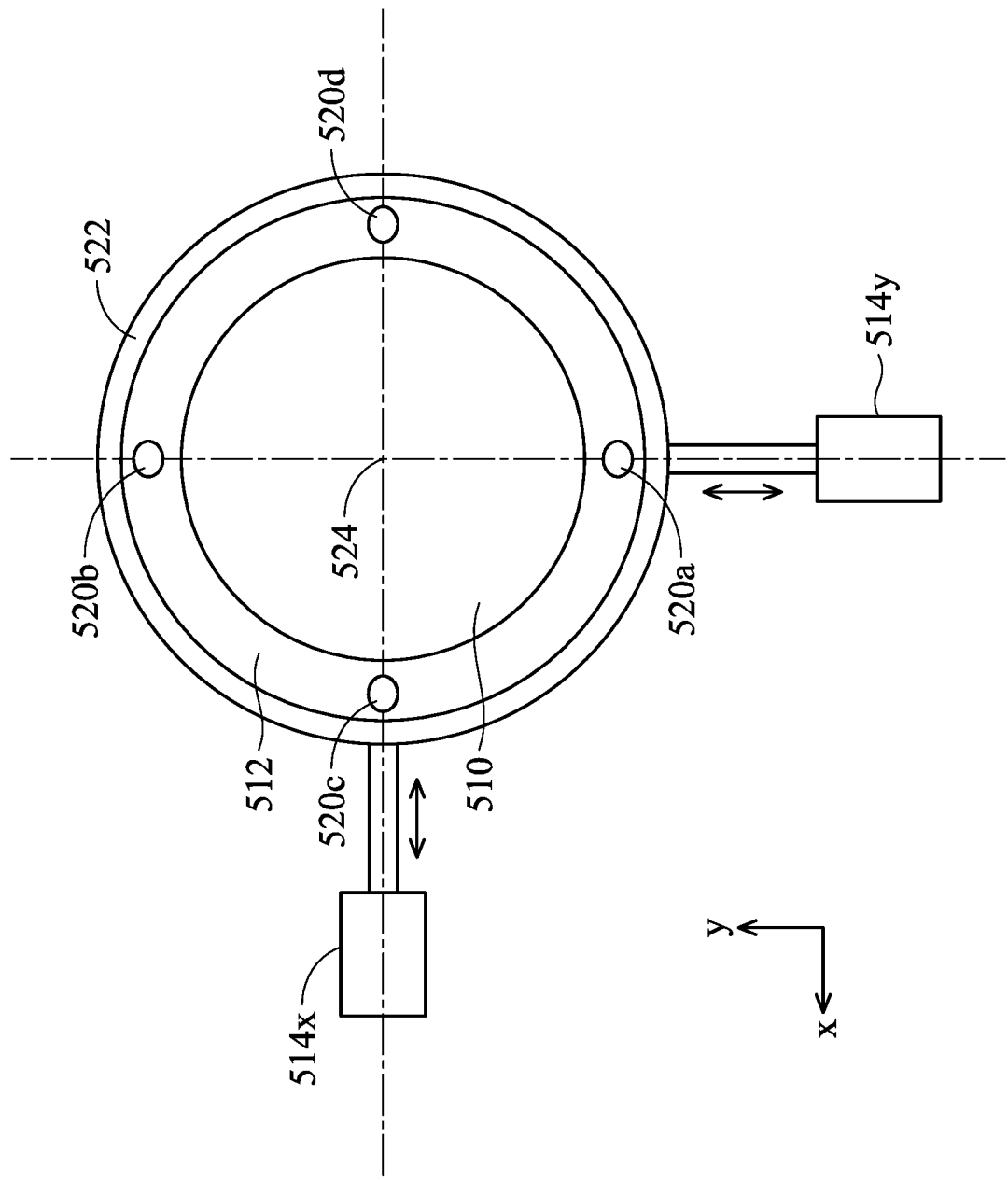
FIG. 5B is a schematic plan view of a dynamic lens with tilting and translation actuators according to some embodiments.

FIG. 5A is a schematic view of a dynamic lens assembly 500 according to some embodiments. The dynamic lens assembly 500 is similar to dynamic lens assembly 400 except the dynamic lens assembly 500 includes lens units having tilting actuators. FIG. 5B is a schematic plan view of a lens unit with tilting and translation actuators.

The dynamic lens assembly 500 includes one or more lens units 502a, 502b, 502c, 502d, and 502e. The dynamic lens assembly 500 is disposed between the radiation source 204 and the appliance 206 to convey a radiation beam from the radiation source 204 to the appliance 206.

Each lens unit 502a-502e includes a lens 510, an inner frame 512 disposed around the lens 510, and an outer frame 522. The lens 510 is similar to the lens 210 described above. In some embodiments, the inner frame 512 is fixedly attached to the lens 510. Translation actuators 514x, 514y are moveably coupled to the outer frame 522 to move the lens 510 within a lens plane 530, which passes through an origin 524 of the lens 510 and is perpendicular to the optical axis 516 of the lens 510. In some embodiments, the translation actuators 514x, 514y are linear actuators (such as mechanical actuators), piezoelectric actuators, cylinders (such as hydraulic or pneumatic cylinders), or the like.

Each lens unit 502a-502e further includes one or more tilting actuators configured to tilt the lens 510. In some embodiments, each lens unit 502a-502e includes tilting actuators 520a, 520b, 520c, 520d (shown in FIG. 5B) to tilt the lens 510 around the x-axis and y-axis. The tilting actuators 520a, 520b, 520c, 520d are coupled between the outer frame 522 and inner frame 512. Movements of the tilting actuators 520a, 520b, 520c, 520d adjust the distances between the outer frame 522 and the inner frame 512 along the circumference of the inner frame 512 or the lens 510. Each tilting actuator 520a, 520b, 520c, 520d is movable independently from one another. The combined movements of the tilting actuator 520a, 520b, 520c, 520d result in the lens 510 tilting about the x-axis and y-axis. The tilting actuator 520a, 520b, 520c, 520c may be linear actuators (such as mechanical actuators), piezoelectric actuators, cylinders (such as pneumatic cylinders and hydraulic cylinders), or the like.

In some embodiments, as shown in FIG. 5B, four tilting actuators 520a, 520b, 520c, 520d are disposed along a circumference of the lens 510 at 90 degrees apart. In some embodiments, relative movements of the tilting actuators 520a, 520b cause the lens 510 to tilt about the x-axis while relative movements of tilting actuators 520c, 520d cause the lens 510 to tilt about y-axis. Other arrangements of the tilting actuators, such as three actuators disposed along the circumference of the lens 510, can be used to achieve the same result.

During operation, a radiation beam travels along an optical path 518 that traverses the lenses 510 in the lens units 502a-502e. When the optical path 518 is at a distance away from origins 524 of the corresponding lenses 510, the radiation beam may deviate from the optical path 518, similar to example in FIG. 3B. In some embodiments, the lens 510 is tilted to correct the deviation of the optical path 518 caused by the offset between the optical path 518 and the origin of the lens 510.

In some embodiments, a controller 508 is connected to the lens units 502a-502e. In some embodiments, the controller 508 is connected to the translation actuators 514x, 514y and the tilting actuators 520a-520d to control the translation and tilting of the lens units 502a-502e.

During operation, an incoming radiation beam is projected to the lens units 502a-502e from an optical path that is offset from the origin 524 of at least one lens 510 to allow multiple regions being used as beam regions. Prior to operation, each lens 510 is translated to have a "clean" region align with the optical path 518 and tilted at a suitable angle to correct any deviation of the optical path 518 caused by the offset between the optical path 518 and the origin 524 of the lens. When the beam region in the lens 510 becomes contaminated or damaged, the lens 510 is translated to align a clean region with the optical path 518 and the tilting angles of the lens 510 are adjusted according to the location of the new beam region.

Other arrangements of actuators can be used to achieve rotation and tilting of the lens 510. For example, the translation actuators 514x, 514y are coupled to the inner frame 512 and positioned to translate the lens 510 relative to the outer frame 522, and the tilting actuators 520a, 520b, 520c, 520d are coupled to the outer frame 522 and positioned to tilt the outer frame 522 and the lens 510 together.

Figure 6:
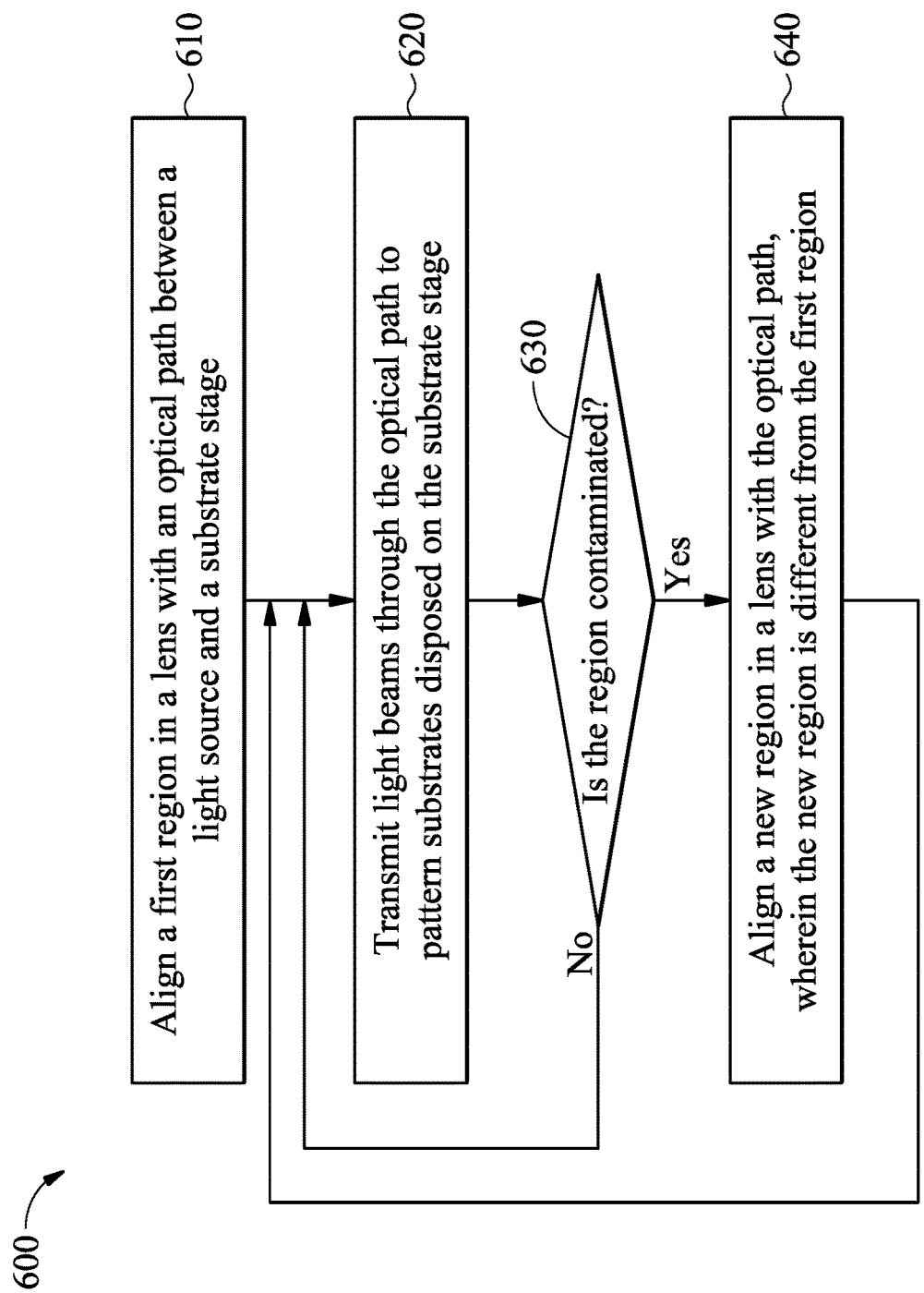
FIG. 6 is a flow chart of a method for performing a lithography process according to some embodiments.

FIG. 6 is a flow chart of a method 600 for performing a lithography process according to some embodiments. The method 600 may be performed using a lithography tool, such as the lithography tool 100, having a dynamic lens assembly, such as the dynamic lens assembly 200, 300, 400, or 500 described above.

In operation 610, a region on a lens is aligned with an optical path between a radiation source and a substrate stage in a lithography tool. The lens is positioned so that an incoming radiation beam traverses a region on the lens that is at a distance away from the origin of the lens. The lens may be disposed anywhere between the radiation source and the substrate stage. In some embodiments, the lens is in an optical assembly between a radiation source, such as a laser source, and a lithography tool. For example, the lens is in the lens assembly 128 in FIG. 1. In other embodiments, the lens is positioned in the lithography tool, such as in a condenser or in a projection lens module. For example, the lens is the condenser unit 112 or the projection optics module 106 in the lithography tool 100 of FIG. 1.

In some embodiments, the region on the lens that is aligned with the optical path is at a distance away from an origin of the lens. In some embodiments, the distance between the origin of the lens and a center of the region is about an outer diameter of the region, and aligning the region with the optical path includes rotating the lens about an optical axis passing the origin of the lens. In other embodiments, aligning the region with the optical path includes translating the lens in a plane perpendicular to the optical path. In some embodiments, the lens is tilted along one or more directions to correct deviation of the optical path caused by the offset between the origin of the lens and the center of the region.

In some embodiments, two or more lenses are positioned to align a region at a distance away from an origin of the corresponding lens with the optical path. In some embodiments, two or more lenses are positioned so that an incoming radiation beam traverses a region on the lens at a distance away for the origin of the lens.

In operation 620, a radiation beam is transmitted along the optical path to perform a lithography process on a substrate disposed on the substrate stage. The radiation beam may be any suitable radiation beam, such as a laser beam, an EUV beam, a UV beam, a x-ray beam, or the like. The lithography process may be a UV lithography process, an EUV lithography process, an immersion lithography process, or the like. In some embodiments, a plurality of substrates and/or a plurality of areas on a substrate are exposed consecutively during operation 620.

In some embodiments, operation 630 is periodically performed to determine whether the region on the lens that aligns with the optical path is contaminated. In some embodiments, the determination is made by measuring an intensity loss of the radiation beam after being transmitted by the lens. For example, an intensity loss greater than a threshold value indicates a significant amount of contamination is accumulated on the region. In some embodiments, the intensity loss can be obtained using intensities of the radiation beam in the optical path before and after the lens, which can be measured using sensors positioned at locations before and after the lens. In some embodiments, the intensity loss can be obtained by monitoring intensity changes at a location in in the optical path after the lens. In some embodiments, when a dynamic lens assembly, such as the dynamic lens assembly 200, 300, 400, or 500, is used, the intensity loss is measured by an intensity difference between the radiation beam received from the radiation source 204 and the radiation beam output to the appliance 206. In some embodiments, the threshold value is in a range between about 10% to about 30%, for example about 20%.

If operation 630 concludes that the region is contaminated, operation 640 is performed. If operation 630 concludes that the region is still in good condition for a lithography process, operation 620 resumes. In some embodiments, operation 630 is omitted. Operation 640 can be performed after a certain number of substrates are processed in operation 620.

In operation 640, the lens is adjusted so that a new region is aligned with the optical path or adjusted to have the radiation beam traverse a new region on the lens. The new region is different from the prior regions. In some embodiments, aligning the new region with the optical path including rotating the lens about an optical axis passing the origin of the lens. In other embodiments, aligning the new region with the optical path including translating the lens in a plane perpendicular to the optical path. In some embodiments, tilting angles of the lens are adjusted in one or more direction to correct deviation of the optical path caused by the offset between the origin of the lens and the center of the new region. After operation 640, operation 620 resumes.

Even though, refractive lens are described in the examples above, embodiments can be used with any suitable optical components, such as refractive components (lens), reflective components (mirrors), magnetic components, electromagnetic components, electrostatic components, or any combination thereof, to utilize multiple regions on an optical surface for operation, thus, extending life span of the optical components. Even though, dynamic lens are described with lithography tools, embodiments can be used in other optical tools.

Embodiments described herein relate to dynamically controlled lens used in lithography tools. Multiple regions of the dynamic lens can be used to transmit a radiation beam for lithography process. By allowing multiple regions to transmit the radiation beam, the dynamically controlled lens can have an extended life cycle compared to conventional fixed lens. The dynamically controlled lens can be replaced or exchanged at a lower frequency, thus, improving efficiency of the lithography tools and reducing production cost.

Some embodiments provide a lens assembly comprising a lens unit configured to be coupled to or in a lithography tool. The lens unit includes an optical lens, and an alignment actuator connected with the optical lens. The alignment actuator is operable to move the optical lens within a lens plane, and the lens plane passes through an origin of the optical lens and is perpendicular to an optical axis of the optical lens.

Some embodiments provide a method. The method comprises aligning a first region on an optical lens with an incoming radiation beam, wherein a center of the first region is at a distance apart from an origin of the optical lens, transmitting the incoming radiation beam through the first region on the optical lens to perform a lithography process, and aligning a second region on the optical lens with the incoming radiation beam, wherein the second region is different from the first region.

Some embodiments provide an apparatus. The apparatus includes a radiation source, a lithography tool, and a dynamic lens assembly positioned in an optical path between the radiation source and a substrate stage in the lithography tool. The dynamic lens assembly comprises one or more lens unit, each lens unit comprising an optical lens, and an alignment actuator coupled to the optical lens, the alignment actuator being movable to align one of multiple regions on the optical lens with the optical path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lens assembly, comprising:
   a lens unit configured to be coupled to or in a lithography tool and positioned in an optical path between a radiation source and a substrate stage in the lithography tool, the lens unit comprising:
   a plurality of optical lenses, each optical lens having an optical axis;
   each of the plurality of optical lenses coupled to its own first frame;
   each of the first frames coupled to its own second frame; and
   each of the first frames coupled to its own translation actuator, each translation actuator being movable to translate the first frame to which it is coupled in a plane perpendicular to the optical axis of the optical lens which is coupled to the same first frame so as to align one of multiple regions on the optical lens with the optical path; and
   each of the first frames coupled to its own tilting actuator and each of the tilting actuators coupled to its own second frame, wherein each tilting actuator is operable to tilt the optical lens, with which the tilting actuator is coupled via the first frame, along a first direction.

2. The lens assembly of claim 1, further comprising a rotation actuator coupled to each of the first frames and coupled to a motor.

3. The lens assembly of claim 1, wherein each lens unit further comprises:
   a second tilting actuator coupled between the first frame and the second frame, wherein the second tilting actuator is operable to tilt the optical lens along a second direction different from the first direction.

4. The lens assembly of claim 1, wherein the translation actuator comprises:
   a first linear actuator positioned to translate the optical lens along a first direction in the lens plane; and a second linear actuator positioned to translate the optical lens along a second direction in the lens plane different from the first direction.

5. The lens assembly of claim 3, wherein the each tilting actuator is operable to tilt the optical lens about a first axis, and the second tilting actuator is operable to tilt the optical lens about a second axis.

6. The lens assembly of claim 1, further comprising a controller connected to the each tilting actuator in the lens unit.

7. A method, comprising:
aligning a first region on an optical lens with an incoming radiation beam, wherein a center of the first region is at a distance apart from an origin of the optical lens;
transmitting the incoming radiation beam through the first region on the optical lens to perform a lithography process;
determining the first region is contaminated;
aligning a second region on the optical lens with the incoming radiation beam, wherein the second region is different from the first region, the aligning a second region on the optical lens accomplished by translating the optical lens in a plane perpendicular to an optical axis of the optical lens with a translation actuator coupled to a first frame coupled to the optical lens; and
tilting the optical lens with a linear actuator, the linear actuator coupled between the first frame and a second frame.

8. The method of claim 7, further comprising:
aligning the second region on the optical lens by rotating the optical lens with a rotation actuator coupled to a first frame coupled to the optical lens and translating the optical lens with a translation actuator coupled to the first frame coupled to the optical lens.

9. The method of claim 8, wherein aligning the first region comprises:
rotating the optical lens about an optical axis of the optical lens.

10. The method of claim 9, wherein aligning the first region further comprises:
tilting the optical lens about a first axis.

11. The method of claim 7, wherein the distance between the origin of the optical lens and the center of the first region is approximately a diameter of the first region.

12. The method of claim 7, wherein aligning the first region further comprises:
tilting the optical lens about a first direction.

13. The method of claim 7, wherein determining the first region is contaminated comprises measuring an intensity loss of the radiation beam after being transmitted through the optical lens.

14. The method of claim 13, wherein the intensity loss is between about 10% to about 30%.

15. An apparatus, comprising:
a radiation source;
a lithography tool; and
a dynamic lens assembly having an optical axis, the dynamic lens assembly positioned in an optical path between the radiation source and a substrate stage in the lithography tool, wherein the dynamic lens assembly comprises:
one or more lens unit, each lens unit comprising:
an optical lens having an optical axis;
a first frame coupled to the optical lens;
a second frame;
a translation actuator coupled to the first frame, the translation actuator being movable to translate the first frame to which it is coupled in a plane perpendicular to the optical axis of the optical lens and movable to align one of multiple regions on the optical lens with the optical path; and
a tilt actuator coupled between the first frame and the second frame, the tilt actuator being movable to align the optical path parallel to the optical axis.

16. The apparatus of claim 15, wherein the translation actuator comprises:
a first linear actuator positioned to move the optical lens along a first direction; and
a second linear actuator positioned to move the optical lens along a second direction different from the first direction.

17. The apparatus of claim 15, further comprising:
a controller coupled to the tilt actuator and the translation actuator of each lens unit.

18. The apparatus of claim 15, wherein the tilt actuator includes:
three tilt actuators disposed along the circumference of the optical lens.

19. The lens assembly of claim 1, wherein the tilt actuator includes three tilt actuators disposed along the circumference of the optical lens.

20. The apparatus of claim 15, further comprising a rotation actuator coupled to the first frame, the rotation actuator being moveable to align one of multiple regions on the optical lens with the optical path.

* * * * *